United States Patent
Wu

(10) Patent No.: US 7,864,834 B1
(45) Date of Patent: Jan. 4, 2011

(54) ESTIMATING DIGITAL FREQUENCY SYNTHESIZER JITTER

(75) Inventor: Yiding Wu, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 904 days.

(21) Appl. No.: 11/588,774

(22) Filed: Oct. 27, 2006

(51) Int. Cl.
*H04B 3/46* (2006.01)

(52) U.S. Cl. .................. 375/226; 375/227; 375/294; 375/376

(58) Field of Classification Search .............. 375/226, 375/227, 294, 376
See application file for complete search history.

(56) References Cited

U.S. PATENT DOCUMENTS

| | | | |
|---|---|---|---|
| 5,889,435 A * | 3/1999 | Smith et al. ................ | 331/1 A |
| 6,687,629 B1 * | 2/2004 | Yamaguchi et al. .......... | 702/69 |
| 6,795,496 B1 * | 9/2004 | Soma et al. ................. | 375/226 |
| 2003/0125888 A1 * | 7/2003 | Yamaguchi et al. .......... | 702/69 |

* cited by examiner

*Primary Examiner*—Shuwang Liu
*Assistant Examiner*—Kabir A Timory
(74) *Attorney, Agent, or Firm*—Kevin T. Cuenot; Thomas George

(57) ABSTRACT

A method of estimating jitter for a DFS can include determining a plurality of linear equations, wherein each linear equation corresponds to, at least in part, a combination of multiplier and divisor attributes for setting an output frequency of the DFS, identifying maximum and minimum values for the slope component and the vertical axis intercept component from the plurality of linear equations, providing an equation for determining minimum jitter given, at least in part, an input frequency, and providing an equation for determining maximum jitter given, at least in part, an input frequency. A linear equation can be derived for estimating jitter of the DFS according to a specified input frequency and a specified value of the divisor attribute of the DFS. The linear equation further can depend upon the minimum jitter and the maximum jitter.

20 Claims, 2 Drawing Sheets

US 7,864,834 B1

ESTIMATING DIGITAL FREQUENCY SYNTHESIZER JITTER

BACKGROUND OF THE INVENTION

Software-based circuit design tools, also referred to as electronic design automation (EDA) tools or computer aided design (CAD) tools are capable of performing various circuit design-related tasks and circuit simulation functions. Circuit designs typically are specified in a programmatic form, i.e., using a hardware description language such as VHDL or Verilog. Hardware description languages permit hardware designers to define signals at a very high level of abstraction which can be translated, by a design tool, into actual pins and circuitry for a target device such as a programmable logic device (PLD). A design tool further can perform an analysis of the circuit design with respect to timing, functionality, and power consumption, as well as provide such information back to the circuit designer in one form or another, i.e., through some sort of visual display.

PLDs are a well-known type of integrated circuit that can be programmed to perform specified logic functions. One type of PLD, the field programmable gate array (FPGA), typically includes an array of programmable tiles. These programmable tiles can include, for example, input/output blocks, configurable logic blocks, dedicated random access memory blocks, multipliers, digital signal processing blocks, processors, clock managers, delay lock loops, digital frequency synthesizers (DFSs), and so forth.

In performing analysis on a given circuit design, a design tool relies upon a model for each of the various circuit elements found within the circuit design. Each model provides a procedure, or technique, for estimating the behavior of the circuit element to which the model corresponds. Thus, the design tool can determine information such as the output, power consumption, timing characteristics, and the like with respect to individual circuit elements as well as the circuit design as a whole.

In illustration, a DFS circuit element can provide an output signal having a frequency that is a function of the frequency of the input signal. An example of a DFS circuit element is the DFS circuit element available within the Virtex family of FPGA devices produced by Xilinx, Inc. of San Jose, Calif. (Xilinx and Virtex are registered trademarks of Xilinx, Inc.) This device can provide an output frequency that is determined by the expression $F_{Out}=F_{In}M/D$, where M and D are user-specified attributes. Ideally, each period of the output signal from the DFS circuit element is exactly the same as any other period of the output signal. The real behavior of the DFS circuit element, however, tends to exhibit a given amount of jitter. That is, each period of the output signal likely varies from the ideal period by a small amount. The amount of jitter found in the output signal of the DFS circuit element can be expressed as peak-to-peak jitter, also referred to as P2P.

Accurately estimating P2P for a DFS can influence circuit design decisions throughout the design process and further help to increase the chance of design success. Within a design tool, if an estimate of P2P is needed, the information typically is obtained by referencing a database comprising a vast amount of jitter data. Such a database tends to be large as the data reflects jitter measurements made across the entire range of possible input frequencies and for all possible combinations of values for M and D that may be used. Storing such a large volume of data requires significant memory resources, which can increase the amount of time used by a design tool to process such data and analyze a circuit design. Further, utilizing this data within a design tool in an effective manner can be a complex undertaking in and of itself.

BRIEF SUMMARY OF THE INVENTION

The present invention is directed to estimating peak-to-peak jitter (P2P) for a digital frequency synthesizer (DFS) circuit element for use on an integrated circuit. One embodiment of the present invention can include a method of estimating jitter for a DFS. The method can include determining a plurality of linear equations, wherein each linear equation corresponds to, at least in part, each combination of multiplier and divisor attributes for setting an output frequency of the DFS. Maximum and minimum values for the slope component and the vertical axis intercept component from the plurality of linear equations can be identified.

An equation for determining minimum jitter given, at least in part, an input frequency can be provided. An equation for determining maximum jitter given, at least in part, an input frequency also can be provided. A linear equation can be derived for estimating jitter of the DFS according to a specified input frequency and a specified value of the divisor attribute of the DFS. The linear equation for estimating jitter further can depend upon the minimum jitter and the maximum jitter that were determined.

Determining a plurality of linear equations can include determining a linear equation for each combination of multiplier and divisor attributes across a plurality of potential input frequencies to the DFS. For each multiplier and divisor attribute combination corresponding to a specified frequency, the method can include sorting jitter data for the DFS according to the divisor attribute and linearizing the jitter data.

Providing an equation for determining minimum jitter can include determining jitter values across a plurality of potential input frequencies to the DFS for a minimum value of the divisor attribute of the DFS. The equation can be defined as $P2P_{Min}=B_{Min}+K_{Min}*F_{In}+A_{Min}*F_{In}^{P_{Min}}$, where $P2P_{Min}$ is the minimum jitter for a selected input frequency $F_{In}$, $B_{Min}$ is a minimum of the vertical axis intercept components from the plurality of linear equations, $K_{Min}$ is a minimum of the slope components from the plurality of linear equations, and $A_{Min}$ and $P_{Min}$ are constants.

Providing an equation for determining maximum jitter can include determining jitter values across a plurality of potential input frequencies to the DFS for a maximum value of the divisor attribute of the DFS. The equation for determining maximum jitter can be defined as $P2P_{Max}=B_{Max}+K_{Max}*F_{In}+A_{Max}*F_{In}^{P_{Max}}$, where $P2P_{Max}$ is the maximum jitter for a selected input frequency $F_{In}$, $B_{Max}$ is a maximum of the vertical intercept component of the plurality of linear equations, $K_{Max}$ is the maximum of the slope components of the plurality of linear equations, and $A_{Max}$ and $P_{Max}$ and are constants.

The linear equation for estimating jitter of the DFS can be defined as $P2P=K_{P2P}*D_{P2P}+B_{P2P}$. Deriving the linear equation can include determining a value of $K_{P2P}$ according to $K_{P2P}=(P2P_{Max}-P2P_{Min})/(D_{Max}-D_{Min})$, wherein $P2P_{Max}$ corresponds to a measure of maximum jitter, $P2P_{Min}$ corresponds to a measure of minimum jitter, $D_{Max}$ corresponds to the maximum value of the divisor attribute, and $D_{Min}$ corresponds to a minimum value of the divisor attribute. Deriving the linear equation also can include determining a value of $B_{P2P}$ according to $B_{P2P}=P2P_{Min}-K_{P2P}*D_{Min}$. An estimate of jitter for the DFS can be provided by solving the linear equation for a given value of the divisor attribute of the DFS.

Another embodiment of the present invention can include a method of estimating jitter for a DFS circuit element for use on an integrated circuit. The method can include calculating a measure of minimum jitter for the DFS, wherein the measure of minimum jitter depends upon an input frequency to the DFS, and calculating a measure of maximum jitter for the DFS, wherein the measure of maximum jitter depends upon the input frequency to the DFS. The method further can include solving a linear equation that approximates the jitter of the DFS for the input frequency and for a given value of the divisor attribute of the DFS.

Calculating a measure of minimum jitter can include solving the equation $P2P_{Min}=B_{Min}+K_{Min}*F_{In}+A_{Min}*F_{In}^{P_{Min}}$, wherein $P2P_{Min}$ is the minimum jitter for a selected input frequency $F_{In}$, and $B_{Min}$, $K_{Min}$, $A_{Min}$, and $P_{Min}$ are constants. Calculating a measure of maximum jitter can include solving the equation $P2P_{Max}=B_{Max}+K_{Max}*F_{In}+A_{Max}*F_{In}^{P_{Max}}$, wherein $P2P_{Max}$ is the maximum jitter for a selected input frequency $F_{In}$, and $B_{Max}$, $K_{Max}$, $A_{Max}$, and $P_{Max}$ are constants.

The method also can include dynamically generating the linear equation that approximates the jitter of the DFS. The linear equation can be defined as $P2P=K_{P2P}*D_{P2P}+B_{P2P}$, wherein P2P is the jitter for a given value of a divisor attribute of the DFS ($D_{P2P}$). Generating the linear equation can include determining a value of $K_{P2P}$ according to $K_{P2P}=(P2P_{Max}-P2P_{Min})/(D_{Max}-D_{Min})$, wherein $P2P_{Max}$ corresponds to the measure of maximum jitter, $P2P_{Min}$ corresponds to the measure of minimum jitter, $D_{Max}$ corresponds to a maximum value of the divisor attribute, and $D_{Min}$ corresponds to the minimum value of the divisor attribute. Generating the linear equation also can include determining a value of $B_{P2P}$ according to $B_{P2P}=P2P_{Min}-K_{P2P}*D_{Min}$.

A solution from the linear equation can be provided as an approximation of jitter for the DFS.

Yet another embodiment of the present invention can include a machine readable storage, having stored thereon a computer program having a plurality of code sections for causing a machine to perform the various steps and functions described herein.

DETAILED DESCRIPTION OF THE INVENTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein are directed to determining an estimate of jitter for circuit elements on a programmable logic device (PLD). An estimate of peak-to-peak jitter, hereafter referred to as "P2P", can be calculated for a Digital Frequency Synthesizer (DFS) as may be implemented on a field programmable gate array (FPGA) type of PLD or other types of integrated circuits. The present invention provides a technique for dynamically determining the algorithms needed to estimate P2P for a DFS circuit element. Note that while the examples presented herein are described with respect to a DFS in an FPGA, the techniques are applicable to P2P estimation in other digital circuits in any type of integrated circuit.

For example, the Virtex family of FPGA devices, available from Xilinx, Inc. of San Jose, Calif. (Xilinx), provides a DFS circuit element. This particular type of DFS can provide an output frequency $F_{Out}$ that is determined by the expression $F_{Out}=F_{In}M/D$, where $F_{In}$ is the input frequency, M is a multiplier, D is a divisor, and both M and D are user-specified parameters. In one embodiment, a measure of P2P for the DFS circuit element can be estimated in terms of the user specifiable parameter D and a particular input frequency $F_{In}$.

By estimating P2P in this manner, the need for storing a significant amount of actual P2P data for simulation and/or testing purposes is avoided. Otherwise, for each possible combination of user-specifiable parameters M and D, over the entire range of possible $F_{In}$, jitter (P2P) data would have to be stored. The embodiments disclosed herein facilitate the dynamic derivation of the equations needed to approximate jitter of a DFS circuit element. The resulting equations allow an estimate of P2P to be provided as a linear function of several input parameters of the DFS itself.

Figure 1:
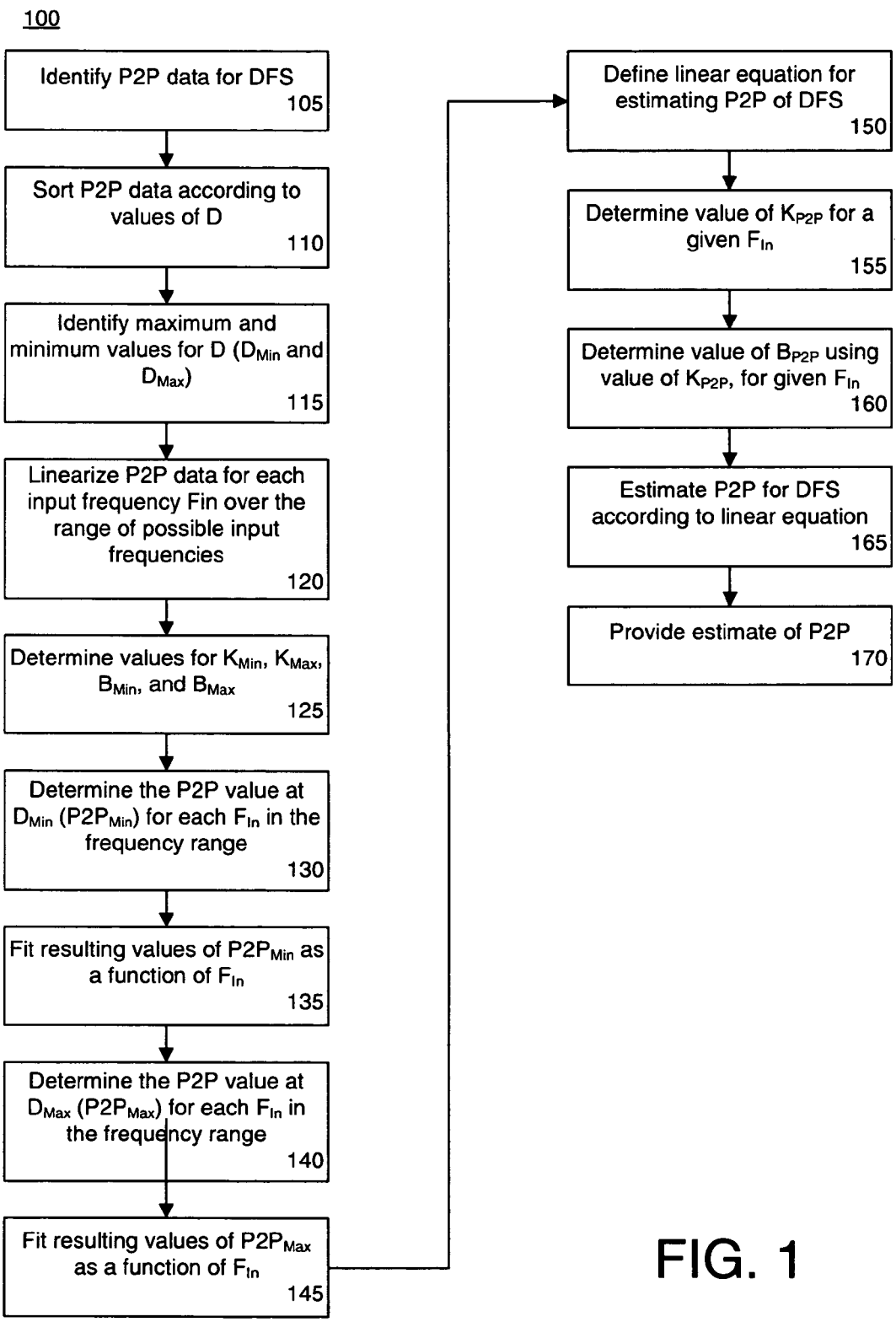
FIG. 1 is a flow chart illustrating a method of determining jitter for a circuit element in accordance with one embodiment of the present invention.

FIG. 1 is a flow chart illustrating a method 100 of determining an estimate of P2P for a DFS in accordance with one embodiment of the present invention. The method 100 can be implemented by a software-based logic design and/or simulation tool executing within one or more suitable information processing systems. The method can begin in a state where P2P data for a DFS has been generated and is stored within a data storage device. The P2P data can include measured values of P2P for each possible combination of the user-specifiable parameters of M and D in reference to the multiplier and divisor in the formula $F_{Out}=F_{In}M/D$. With respect to the DFS described above, both M and D can range from 1-32, though it should be appreciated that such parameters can vary according to the particular DFS used. Further, within the P2P data, the P2P for of each combination of M and D across each possible value of $F_{In}$ can be specified. In step 105, the P2P data can be identified.

In step 110, the P2P data can be sorted according to the values for the parameter D. From the sorted P2P data, a maximum value of D, denoted as $D_{Max}$, and the minimum value of D, denoted as $D_{Min}$, can be determined in step 115. For example, with respect to the DFS available in certain devices from Xilinx, $D_{Min}=1$ and $D_{Max}=32$. It should be appreciated, however, that these values are device specific and, thus, will vary according to the particular DFS used. In step 120, the P2P data can be linearized for each $F_{In}$. That is, a linear approximation of the P2P data, on a per input frequency basis, can be determined. The resulting equations determined from the linearization, for a given $F_{In}$, can take the form of $P2P=K*D+B$, wherein K and B are constants determined from the linearization process. Accordingly, for each of the possible input frequencies $F_{In}$ that can be provided to the DFS, a linear equation in the form $P2P=K*D+B$ can be determined.

In the steps to follow, techniques are described for deriving the linear equations, or approximations of the linear equations, determined in step 110. By providing a mechanism for dynamically deriving the equations, the need to store each linear equation across the range of values for $F_{In}$ that was determined in step 120 is eliminated. This can significantly reduce the amount of overhead involved in providing P2P, or an estimate thereof, for a given DFS. In general, for a given value of D and for a given value of $F_{In}$, the linear equation originally determined in step 120, or an approximation thereof, can be recovered or generated.

In step 125, the minimum value of K, denoted as $K_{Min}$, the maximum value of K, denoted as $K_{Max}$, the minimum value of B, denoted as $B_{Min}$, and the maximum value of B, denoted as $B_{Max}$ can be determined from the P2P data identified with reference to step 105. The term K corresponds to the slope component of the linear equations while the term B corresponds to the vertical axis intercept component of the linear equations. It should be appreciated that the minimum and maximum values of K and B can be determined across the entire set of linear equations generated in step 120, without reference to input frequency. These values can be stored for future use such that the linearization process need not be undertaken each time a value of P2P is desired.

In step 130, the P2P value at $D_{Min}$, denoted as $P2P_{Min}$, for each $F_{In}$ in the allowable frequency range for the DFS can be calculated using the linear equations derived in step 120. In step 135, the resulting $P2P_{Min}$ values can be fit as a function of $F_{In}$. That is, a function for determining $P2P_{Min}$ as a function of $F_{In}$ can be determined. The resulting equation for approximating values of P2P for $D_{Min}$, where D=1 in this case, can be expressed as $P2P_{Min}=B_{Min}+K_{Min}*F_{In}+A_{Min}*F_{In}^{P_{Min}}$, where the values for $B_{Min}$ and $K_{Min}$ have been determined as described herein, and $A_{Min}$ and $P_{Min}$ are constants that are dependent upon the particular physical implementation of the DFS circuit element and the operating state of the DFS. Values for $F_{In}$ can be expressed in terms of megahertz, i.e., 40 MHz specified as 40 rather than 40,000,000. It should be appreciated that various well known software tools can perform linear and/or curve fitting functions as described herein. In this regard, the general equation listed for $P2P_{Min}$ and $P2P_{Max}$ includes a linear component as well as a power component.

With reference to the DFS implementation available within selected Xilinx FPGAs, for example, such DFS circuit elements can operate in a low frequency (LF) mode or a high frequency (HF) mode. The constants for $A_{Min}$ and $P_{Min}$ will vary depending upon the particular mode in which the DFS is operated in a given circuit design, i.e., LF or HF. Thus, for the HF operating state, $A_{Min}=0$ and $P_{Min}=0$. For the LF operating state, $A_{Min}=1114$ and $P_{Min}=-0.5057$. Other DFS implementations may have other operating modes with corresponding constants, as is known to those of skill in the art.

Figure 2:
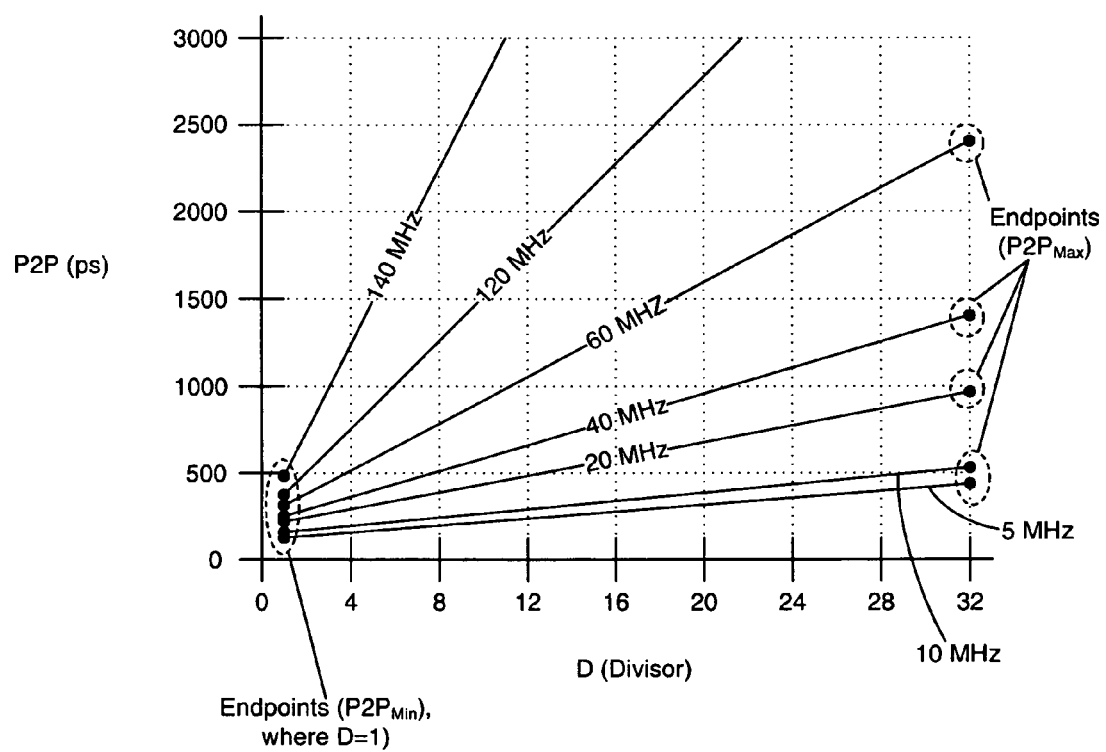
FIG. 2 is a graph which is useful for understanding the embodiments of the present invention as disclosed herein.

FIG. 2 illustrates the different values for $P2P_{Min}$ that can be determined using the above equation. As shown, the values of $P2P_{Min}$ for D=1 serve as endpoints for lines which provide the estimated P2P given a particular value of $F_{In}$ and D. Thus, rather than storing a large number of linear equations as derived in step 120, a technique can be provided for deriving the linear equations. The expression $P2P_{Min}=B_{Min}+K_{Min}*F_{In}+A_{Min}*F_{In}^{P_{Min}}$ determined in step 135 provides a mechanism for determining a first set of endpoints where D=1 for recovering or deriving the linear equations of step 120.

Referring back to FIG. 1, in step 140, the P2P value at $D_{Max}$, denoted as $P2P_{Max}$, for each $F_{In}$ in the allowable frequency range for the DFS can be calculated using the linear equations derived in step 120. In step 145, the resulting $P2P_{Max}$ values can be fit as a function of $F_{In}$. The resulting equation for approximating values of P2P for $D_{Max}$, where D=32 in this case, can be expressed as $P2P_{Max}=B_{Max}+K_{Max}*F_{In}+A_{Max}*F_{In}^{P_{Max}}$. The values for $B_{Max}$ and $K_{Max}$ can be determined as described herein, and $A_{Max}$ and $P_{Max}$ can be constants that are dependent upon the particular physical implementation of the DFS circuit element and the operating state of the DFS.

As was the case with $A_{Min}$ and $P_{Min}$, the constants for $A_{Max}$ and $P_{Max}$ can vary depending upon the particular mode in which the DFS operates, e.g., LF or HF. For the HF operating state, $A_{Max}=6832$ and $P_{Max}=-0.5422$. For the LF operating state, $A_{Max}=31157$ and $P_{Max}=-0.8517$. Table 1 below provides exemplary parameter values that have been determined as discussed herein and which can be used in calculating $P2P_{Min}$ and $P2P_{Max}$ for selected Xilinx FPGA devices.

TABLE 1

|    | Bmin | Kmin | Amin | Pmin | Bmax | Kmax | Amax | Pmax |
|----|------|------|------|------|------|------|------|------|
| HF | 156  | -0.1 | 0    | 0    | 0    | 0    | 6832 | -0.5422 |
| LF | 0    | 0    | 1114 | -0.50570 | 0 | 0 | 31157 | -0.8517 |

After steps 135 and 145, the beginning and endpoints for lines for different values of $F_{In}$ can now be determined as a function. With the starting point and ending point of a line given by the equations of steps 135 and 145 respectively, it can be seen from FIG. 2 that the slope of such a line can be readily determined to recover, or estimate, the linear equations originally determined in step 120 by linearizing the P2P data. That is, a linear equation for estimating P2P can be derived dynamically using the steps and procedures disclosed herein. Such a process, as noted, can begin with determining the endpoints at D=1 and D=32 respectively, for a given $F_{In}$.

Continuing with FIG. 1, in step 150, a linear equation of the form $P2P=K_{P2P}*D_{P2P}+B_{P2P}$ can be defined for providing an estimate of P2P for the DFS circuit for a given value of D, denoted as $D_{P2P}$, and for a given $F_{In}$. In step 155, a value of $K_{P2P}$ can be determined for a given input frequency $F_{In}$. The value of $K_{P2P}$ can be determined as follows: $K_{P2P}=(P2P_{Max}-P2P_{Min})/(D_{Max}-D_{Min})$. Since the expressions for $P2P_{Max}$ and $P2P_{Min}$ include $F_{In}$ as a term, it can be seen that the calculation of $K_{P2P}$ corresponds to a specified input frequency $F_{In}$.

In step 160, the value of $B_{P2P}$ can be determined as $B_{P2P}=P2P_{Min}-K_{P2P}*D_{Min}$. From the expression, it can be seen that $B_{P2P}$ is also determined for a given input frequency $F_{In}$ as both $P2P_{Min}$ and $K_{P2P}$ include $F_{In}$ as a term. In step 165, an estimate of P2P can be determined according to the following equation: $P2P=K_{P2P}*D_{P2P}+B_{P2P}$. The resulting linear formula provides an estimate of P2P for a given DFS given a particular value for D and a particular input frequency $F_{In}$. In step 170, the estimate of P2P can be provided. For example, the estimate of P2P can be used in further circuit simulations, displayed to the user, or included in further simulation and/or test results displayed or otherwise presented to a user for a given circuit design.

To better illustrate the various steps discussed with reference to FIG. 1, consider an example in which the P2P of a DFS is desired given an input frequency $F_{In}$ of 40 MHz, where D=16. Further, assume that the DFS will be operated in LF mode. Accordingly, the following constants will be known: $A_{Min}=1114$, $A_{Max}=31157$, $P_{Min}=-0.5057$, and $P_{Max}=-0.8517$. Having already collected the P2P data, sorted the P2P data by D, and linearized the P2P data for the range of possible $F_{In}$, it should be appreciated that such steps need not be repeated each time an estimate of jitter is to be performed. Still, if other underlying assumptions, such as the frequency mode, power supply voltage level, system noise, etc., change, the entire methodology can be repeated. In any case, once values for $B_{Min}$, $B_{Max}$, $K_{Min}$, and $K_{Max}$ have been determined from the linearization data, they can be stored in and recalled from a memory.

The process can begin with the determination of the endpoints $P2P_{Min}$ and $P2P_{Max}$, where $F_{In}=40$ and $D_{P2P}=16$. As illustrated in FIG. 1, a value for $P2P_{Min}$, given a 40 MHz input frequency, can be calculated as follows:

$$P2P_{Min} = B_{Min} + K_{Min} * F_{In} + A_{Min} * F_{In}^{P_{Min}}$$
$$= 0 + 0 * F_{In} + 1114 * F_{In}^{P_{Min}}$$
$$= 1114 * F_{In}^{-0.5057}$$
$$= 1114 * 40^{-0.5057}$$
$$= 172.47$$

A value for $P2P_{Max}$, given a 40 MHz input frequency, can be calculated as follows:

$$P2P_{Max} = B_{Max} + K_{Max} * F_{In} + A_{Max} * F_{In}^{P_{Max}}$$
$$= 0 + 0 * F_{In} + 31157 * F_{In}^{P_{Max}}$$
$$= 31157 * F_{In}^{-0.8517}$$
$$= 31157 * 40^{-0.5057}$$
$$= 1346.11$$

With the endpoints $P2P_{Min}$ and $P2P_{Max}$ for the line which specifies P2P as a function of D for a given $F_{In}$, the remaining parameters of the linear equation can be determined. A value of $K_{P2P}$ can be determined as follows.

$$K_{P2P} = (P2P_{Max} - P2P_{Min})/(D_{Max} - D_{Min})$$
$$= (1346.11 - 172.47)/(32 - 1)$$
$$= 37.86$$

A value of $B_{P2P}$ can be determined as follows:

$$B_{P2P} = P2P_{Min} - K_{P2P} * D_{Min}$$
$$= 172.47 - 37.86 * 1$$
$$= 134.61$$

Finally, a value for P2P can be determined. As noted, in this example a value of $D_{P2P}=16$ was desired with an input frequency $F_{In}$ of 40 MHz. The, estimated P2P can be calculated as:

$$P2P = K_{P2P} * D_{P2P} + B_{P2P}$$
$$= 37.86 * 16 + 134.61$$
$$740.36$$

Thus, for a $D_{P2P}=16$ and an $F_{In}=40$ (MHz), the P2P is estimated at approximately 740.36 ps.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s).

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein. The present invention also can be embedded in a computer program product, which comprises all the features enabling the implementation of the methods described herein, and which when loaded in a computer system is able to carry out these methods.

The terms "computer program", "software", "application", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising, i.e. open language. The term "coupled", as used herein, is defined as connected, although not necessarily directly, and not necessarily mechanically, i.e. communicatively linked through a communication channel or pathway or another component or system.

This invention can be embodied in other forms without departing from the spirit or essential attributes thereof. Accordingly, reference should be made to the following claims, rather than to the foregoing specification, as indicating the scope of the invention.

What is claimed is:

1. A method of estimating jitter for a digital frequency synthesizer (DFS) circuit element for use on an integrated circuit, the method comprising:
   determining a plurality of linear equations, wherein each linear equation comprises a combination of multiplier and divisor attributes and sets an output frequency of the DFS;
   identifying maximum and minimum values for a slope component and a vertical axis intercept component from the plurality of linear equations;
   providing an equation, comprising a constant that depends upon an operational mode of the DFS, for determining minimum jitter of the DFS given, at least in part, an input frequency;
   providing an equation, comprising a constant that depends upon the operational mode of the DFS, for determining maximum jitter of the DFS given, at least in part, an input frequency; and
   deriving a linear equation for estimating jitter of an output signal of the DFS according to a specified input frequency provided to the DFS and a specified value of the divisor attribute of the DFS, wherein the linear equation for estimating jitter further depends upon the minimum jitter and the maximum jitter.

2. The method of claim 1, wherein determining a plurality of linear equations further comprises determining a linear equation for each combination of multiplier and divisor attributes across a plurality of potential input frequencies to the DFS.

3. The method of claim 2, wherein determining a plurality of linear equations further comprises, for each multiplier and divisor attribute combination corresponding to a specified input frequency, sorting jitter data for the DFS according to the divisor attribute and linearizing the jitter data.

4. The method of claim 1, wherein providing an equation for determining minimum jitter further comprises determining jitter values across a plurality of potential input frequencies to the DFS for a minimum value of the divisor attribute of the DFS.

5. The method of claim 4, wherein providing an equation for determining minimum jitter further comprises defining the equation to be $P2P_{Min}=B_{Min}+K_{Min}*F_{In}+A_{Min}*F_{In}^{P_{Min}}$, where $P2P_{Min}$ is the minimum jitter for a selected input frequency $F_{In}$, $B_{Min}$ is a minimum of the vertical axis intercept components from the plurality of linear equations, $K_{Min}$ is a minimum of the slope components from the plurality of linear equations, and $A_{Min}$ and $P_{Min}$ are constants.

6. The method of claim 1, wherein providing an equation for determining maximum jitter further comprises determining jitter values across a plurality of potential input frequencies to the DFS for a maximum value of the divisor attribute of the DFS.

7. The method of claim 6, wherein providing an equation for determining maximum jitter further comprises defining the equation to be $P2P_{Max}=B_{Max}+K_{Max}*F_{In}+A_{Max}*F_{In}^{P_{Max}}$, where $P2P_{Max}$ is the maximum jitter for a selected input frequency $F_{In}$, $B_{Max}$ is the maximum vertical intercept component from the plurality of linear equations, $K_{Max}$ is the maximum slope component from the plurality of linear equations, and $A_{Max}$ and $P_{Max}$ are constants.

8. The method of claim 1, wherein the linear equation is defined as $P2P=K_{P2P}*D_{P2P}+B_{P2P}$, wherein deriving a linear equation for estimating jitter of the DFS further comprises:
   determining a value of $K_{P2P}$ according to $K_{P2P}=(P2P_{Max}-P2P_{Min})/(D_{Max}-D_{Min})$, wherein $P2P_{Max}$ corresponds to a measure of maximum jitter, $P2P_{Min}$ corresponds to a measure of minimum jitter, $D_{Max}$ corresponds to the maximum value of the divisor attribute, and $D_{Min}$ corresponds to a minimum value of the divisor attribute; and
   determining a value of $B_{P2P}$ according to $B_{P2P}=P2P_{Min}-K_{P2P}*D_{Min}$.

9. The method of claim 1, further comprising providing an estimate of jitter for the DFS by solving the linear equation for a given value of the divisor attribute of the DFS.

10. A method of estimating jitter for a digital frequency synthesizer (DFS) circuit element for use on an integrated circuit, the method comprising:
    calculating a measure of minimum jitter for the DFS, wherein the measure of minimum jitter depends upon an input frequency to the DFS circuit and a constant that depends upon an operational mode of the DFS circuit;
    calculating a measure of maximum jitter for the DFS circuit, wherein the measure of maximum jitter depends upon the input frequency to the DFS circuit and a constant that depends upon an operational mode of the DFS circuit; and
    solving a linear equation that approximates the jitter of an output signal of the DFS circuit according to the input frequency provided to the DFS circuit and a given value of a divisor attribute of the DFS circuit,
    wherein calculating a measure of minimum jitter for the DFS circuit further comprises identifying a minimum of a vertical axis intercept component and a minimum of a slope component from the linear equation.

11. The method of claim 10, wherein calculating a measure of minimum jitter for the DFS circuit further comprises solving the equation $P2P_{Min}=B_{Min}+K_{Min}*F_{In}+A_{Min}*F_{In}^{P_{Min}}$, wherein $P2P_{Min}$ is the minimum jitter for a selected input frequency $F_{In}$, and $B_{Min}$, $K_{Min}$, $A_{Min}$, and $P_{Min}$ are constants.

12. The method of claim 11, wherein calculating a measure of maximum jitter for the DFS circuit further comprises solving the equation $P2P_{Max}=B_{Max}+K_{Max}*F_{In}+A_{Max}*F_{In}^{P_{Max}}$, wherein $P2P_{Max}$ is the maximum jitter for a selected input frequency $F_{In}$, and $B_{Max}$, $K_{Max}$, $A_{Max}$, and $P_{Max}$ are constants.

13. The method of claim 12, further comprising dynamically generating the linear equation that approximates the jitter of the DFS circuit, wherein the linear equation is defined as $P2P=K_{P2P}*D_{P2P}+B_{P2P}$, wherein P2P is the jitter for a given value of a divisor attribute of the DFS circuit ($D_{P2P}$).

14. The method of claim 13, wherein dynamically generating the linear equation further comprises:
    determining a value of $K_{P2P}$ according to $K_{P2P}=(P2P_{Max}-P2P_{Min})/(D_{Max}-D_{Min})$, wherein $P2P_{Max}$ corresponds to a measure of maximum jitter, $P2P_{Min}$ corresponds to a measure of minimum jitter, $D_{Max}$ corresponds to the maximum value of the divisor attribute, and $D_{Min}$ corresponds to a minimum value of the divisor attribute; and
    determining a value of $B_{P2P}$ according to $B_{P2P}=P2P_{Min}-K_{P2P}*D_{Min}$.

15. The method of claim 10, further comprising providing a solution from the linear equation as an approximation of jitter for the DFS circuit.

16. A non-transitory machine readable storage medium, having stored thereon a computer program having a plurality of code sections for estimating jitter for a digital frequency synthesizer (DFS) circuit element for use on an integrated circuit, the machine readable storage comprising:
    code for calculating a measure of minimum jitter for the DFS circuit, wherein the measure of minimum jitter depends upon an input frequency to the DFS circuit and a constant that depends upon an operational mode of the DFS circuit;

code for calculating a measure of maximum jitter for the DFS circuit, wherein the measure of maximum jitter depends upon the input frequency to the DFS circuit and a constant that depends upon an operational mode of the DFS circuit; and code for solving a linear equation that approximates the jitter of an output signal from the DFS circuit according to the input frequency provided to the DFS circuit and a given value of a divisor attribute of the DFS circuit and providing the solution of the linear equation, wherein calculating a measure of minimum jitter for the DFS circuit further comprises identifying a minimum of a vertical axis intercept component and a minimum of a slope component from the linear equation.

17. The non-transitory machine readable storage medium of claim 16, wherein the code for calculating a measure of minimum jitter for the DFS circuit further comprises code for solving the equation $P2P_{Min}=B_{Min}+K_{Min}*F_{In}+A_{Min}*F_{In}^{P_{Min}}$, wherein $P2P_{Min}$ is the minimum jitter for a selected input frequency $F_{In}$, and $B_{Min}$, $K_{Min}$, $A_{Min}$, and $P_{Min}$ are constants.

18. The non-transitory machine readable storage medium of claim 17, wherein the code for calculating a measure of maximum jitter for the DFS circuit further comprises code for solving the equation $P2P_{Max}=B_{Max}+K_{Max}*F_{In}+A_{Max}*F_{In}^{P_{Max}}$, wherein $P2P_{Max}$ is the maximum jitter for a selected input frequency $F_{In}$, and $B_{Max}$, $K_{Max}$, $A_{Max}$, and $P_{Max}$ are constants.

19. The non-transitory machine readable storage medium of claim 18, further comprising code for dynamically generating the linear equation that approximates the jitter of the DFS circuit, wherein the linear equation is defined as $P2P=K_{P2P}*D_{P2P}+B_{P2P}$, wherein P2P is the jitter for a given value of a divisor attribute of the DFS circuit ($D_{P2P}$).

20. The non-transitory machine readable storage medium of claim 19, wherein the code for dynamically generating the linear equation further comprises:

code for determining a value of $K_{P2P}$ according to $K_{P2P}=(P2P_{Max}-P2P_{Min})/(D_{Max}-D_{Min})$, wherein $P2P_{Max}$ corresponds to a measure of maximum jitter, $P2P_{Min}$ corresponds to a measure of minimum jitter, $D_{Max}$ corresponds to a maximum value of the divisor attribute, and $D_{Min}$ corresponds to a minimum value of the divisor attribute; and code for determining a value of $B_{P2P}$ according to $B_{P2P}=P2P_{Min}-K_{P2P}*D_{Min}$.

* * * * *